United States Patent [19]
Arnold

[11] Patent Number: 5,856,752
[45] Date of Patent: *Jan. 5, 1999

[54] DRIVER CIRCUIT WITH PRECHARGE AND ACTIVE HOLD

[75] Inventor: Barry J. Arnold, Fort Collins, Colo.

[73] Assignee: Hewlett-Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 710,230

[22] Filed: Sep. 13, 1996

[51] Int. Cl.⁶ .......................................... H03K 3/00
[52] U.S. Cl. .......................................... 327/112; 365/203
[58] Field of Search ...................... 327/108, 112, 327/163, 178, 180, 185, 259, 309, 310, 321, 328, 389, 391, 437; 326/82, 86, 87, 95–98; 365/203

[56] References Cited

U.S. PATENT DOCUMENTS 4,885,716  12/1989  Little ........................................ 364/786
5,105,104  4/1992  Eisele et al. ............................... 326/86
5,148,047  9/1992  Spohrer ...................................... 326/86
5,189,319  2/1993  Fung et al. ................................. 326/86
5,361,229  11/1994  Chiang et al. ........................... 365/203
5,502,414  3/1996  Tran et al. ................................. 327/91
5,559,456  9/1996  Hatsuda ................................... 365/203
5,572,473  11/1996  Robertson ................................ 365/203

*Primary Examiner*—My-Trang Nu Ton
*Attorney, Agent, or Firm*—Augustus W. Winfield

[57] ABSTRACT

A driver circuit for capacitively loaded lines. The driver circuit has both precharge/pull-low and hold-high. The capacitively loaded line is precharged during a precharge phase of a clock signal. The driver circuit is active only during a drive phase of a clock signal. The driver has a hold-up transistor that is sufficiently large to suppress noise coupled into the line during the drive phase, but is substantially smaller than what is required to make pull-up time equal to pull-down time. The driver circuit provides the low noise characteristics of push-pull but with less circuit area and line capacitance than typical push-pull driver circuits.

3 Claims, 3 Drawing Sheets

DRIVER CIRCUIT WITH PRECHARGE AND ACTIVE HOLD

FIELD OF INVENTION

This invention relates generally to integrated circuits and more specifically to driver circuits for highly capacitive lines.

BACKGROUND OF THE INVENTION

The overall performance of a complex digital electronic circuit, such as a microprocessor, is often limited by the speed of the slowest electrical path within that circuit. Often, this path involves a capacitively loaded line. Each driver or receiver circuit on a line adds some capacitive load to a line. In addition, there are coupling capacitances to structures in adjacent layers and to adjacent lines within the same interconnect layer. In modern IC processes, line spacing is decreasing. Adjacent-line coupling capacitances within the same interconnect layer are becoming higher than the coupling capacitances between layers and are becoming higher than coupling capacitances for previous generations of IC processes. In submicron IC processes, capacitance to adjacent lines on the same interconnect layer may be the largest single contributor to overall line capacitance. One result is that lines are becoming more susceptible to noise induced by the transition of one or more adjacent lines on the same interconnect layer. If noise is great enough it may result in erroneous operation.

There are two common solutions to driving heavily loaded lines. The first solution is to use push-pull drivers in which the driver actively drives the line either high or low. Both the pull-up and pull-down devices must provide sufficient current to drive a capacitively loaded line to a logical one or zero within a specified fraction of a clock cycle. Additionally, both the pull-up and pull-down devices must provide sufficient drive strength (current) to suppress noise coupled onto the line. However, the ability to rapidly drive the line both low and high comes at the expense of size and line capacitance as discussed below.

In a typical push-pull driver designed in complementary-metal-oxide-semiconductor (CMOS) technology, a p-channel device is used for pull-up and an n-channel device is used for pull down. For an MOS transistor, the saturation value of the drain current $I_{DO}$ is given by the following equation:

$$I_{DO} = \frac{\mu_S C_{OX} W}{2L} (V_{GS} - V_{TH})^2$$

In the above equation, $\mu_S$ is surface mobility of the majority carriers, $C_{OX}$ is the capacitance per unit area of the gate electrode, W is the width of the transistor, L is the length of the transistor, $V_{GS}$ is the voltage from gate to source, and $V_{TH}$ is the threshold voltage. Note that $\mu_S$ for holes (p-channel devices) is in the range of 150–250 cm$^2$/V-sec and $\mu_S$ for electrons (n-channel devices) is in the range of 300–600 cm$^2$/V-sec.

From the above equation, in a push/pull driver, to provide the same rise time as fall time, the size (W/L) of the p-channel pull-up transistor must be about 2.4 times the size (W/L) of the n-channel pull-down transistor. This leads to increased area requirements for the overall integrated circuit to accommodate the large p-channel pull-up transistors. In addition, capacitive loading imposed on a line by a transistor is directly proportional to the size of the transistor, so the large p-channel pull-up transistors increase the capacitance on each driven line. Therefore, it is desirable to eliminate the need for large pull-up transistors.

In a second common solution for driving heavily loaded lines, the line is precharged through a single precharge transistor during a precharge phase of a clock. Then, during a drive phase of the clock, pull-down drivers optionally discharge the line. All the driver pull-up transistors are eliminated (replaced by a single precharge transistor), reducing the circuit area and the capacitance on the line. In addition, the solution takes advantage of the smaller size of the n-channel pull-down transistors. However, during the drive phase, lines that are not discharged are left at a high impedance (floating), with potential susceptibility to noise. In particular, in submicron IC processes, precharge/pull-down bus structures are prone to failure due to the increased cross-coupling to adjacent lines.

In general, push-pull drivers provide lower susceptibility to coupling noise at the expense of increased area and increased line capacitance, whereas precharged lines provide smaller area and lower line capacitance at the expense of increased susceptibility to coupled noise. There is a need for low noise lines as provided by active push-pull drivers but with a smaller circuit area.

SUMMARY OF THE INVENTION

A circuit is provided that is a hybrid of push-pull and precharge. A single precharge transistor is used to precharge a line during a precharge clock phase. However, rather than leave the line floating, each driver, if enabled, provides a small active hold-up transistor to suppress noise during the drive phase. Drivers that are not enabled have high impedance (tri-state) outputs. The size of the hold-up transistor is not large enough to drive the line quickly, but is just large enough to suppress any noise coupled into the line by adjacent traces. Therefore, the circuit provides the low noise characteristics of a push-pull driver but with less circuit area and line capacitance compared to typical push-pull drivers. Because the hold-up devices are smaller than typical push-pull pull-up devices, the line has less capacitive loading, enabling smaller pull-down transistors for a given speed or faster speed for a given size of pull-down transistors.

DETAILED DESCRIPTION OF THE PREFERRED EMBODIMENT OF THE INVENTION

Figure 1:
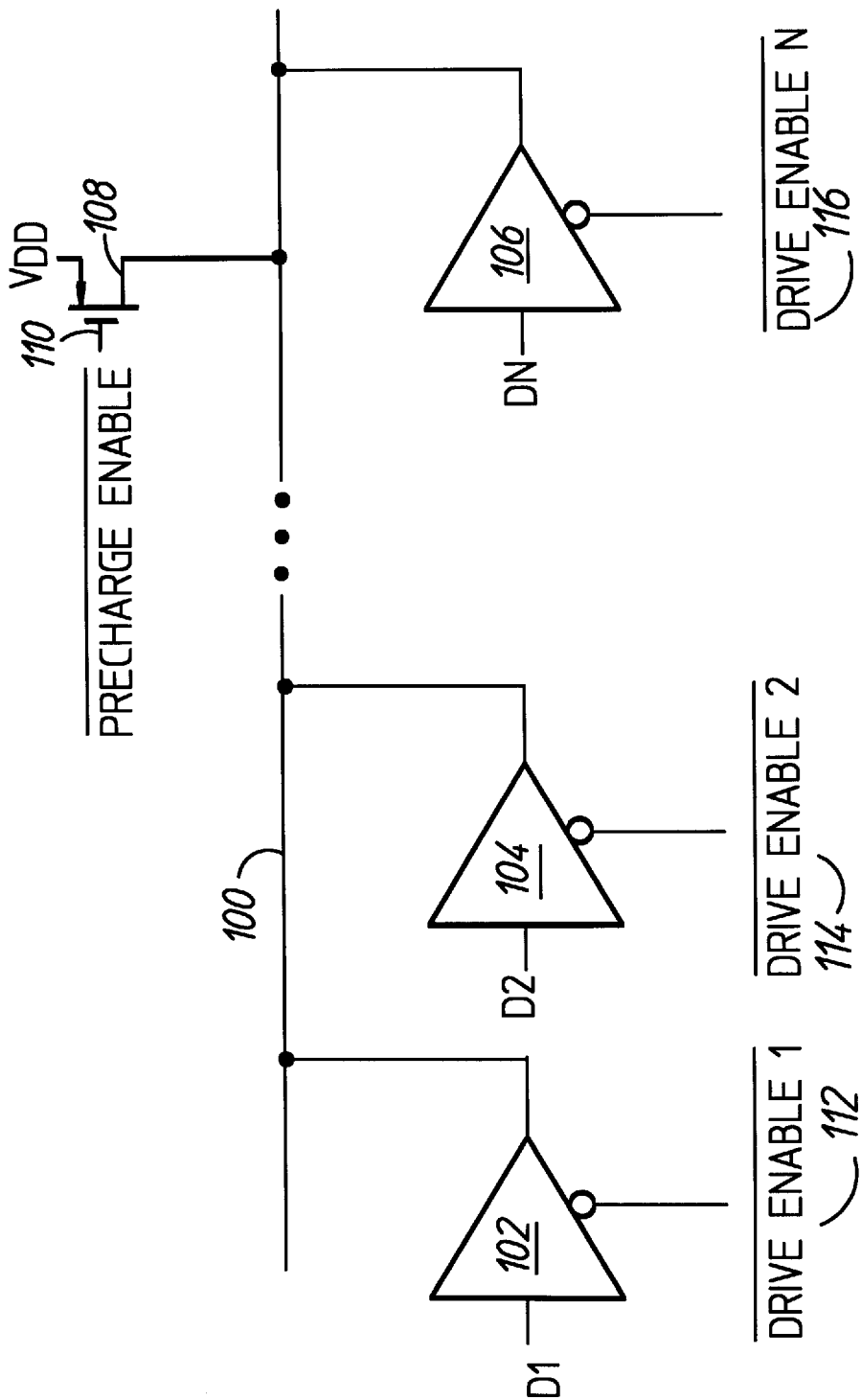
FIG. 1 is a simplified schematic of a line with a precharge transistor and multiple drivers in accordance with the invention.

In FIG. 1, a digital signal line 100 is driven by a precharge transistor 108 and a plurality of tri-state drivers (102, 104, 106). The precharge transistor 108 is on only when an enable signal (PRECHARGE ENABLE 110) is low. Precharge transistor 108 is sufficiently large to pull line 100 high during a precharge phase of a clock signal. Each tri-state driver is active (high or low) only when an enable signal (DRIVE ENABLE 112, 114, 116) is low. Drivers are enabled only during a drive phase of a clock signal (illustrated in FIG. 3) and only one tri-state driver is enabled during any one drive phase.

Figure 2:
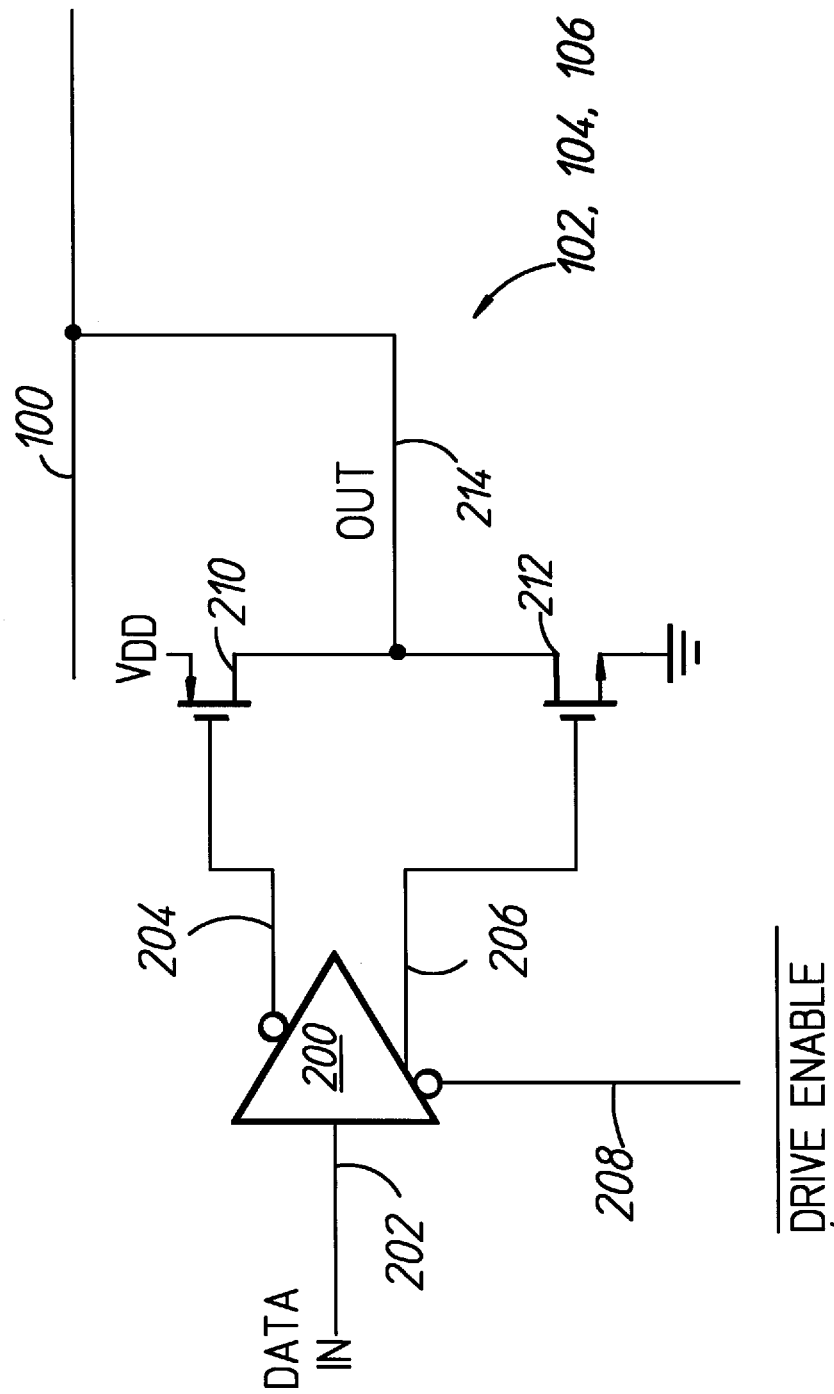
FIG. 2 is a simplified schematic of one of the drivers illustrated in FIG. 1.

FIG. 2 provides additional detail for the drivers (FIG. 1, 102, 104 and 106). A buffer amplifier 200 has an input 202, an inverted output 204, a non-inverted output 206, and an enable input 208. Buffer amplifier 200 drives a circuit that has a hold-up transistor 210, a pull-down transistor 212, and an output 214. When the enable input 208 is high, both transistors 210 and 212 are off. When the enable input 208 is low, the output 214 is driven to the same logical level as the input 202. More precisely, line 100 is either held high by transistor 210 after having been precharged high earlier by transistor 108 (FIG. 1), or line 100 is driven low rapidly by transistor 212. Transistor 212 is large enough to pull line 100 down within a specified fraction of a clock cycle. Hold-up transistor 210 is relatively small, too small to pull line 100 up as fast as transistor 212 can pull line 100 low, but sufficiently large to reduce coupled noise on line 100 during a drive phase. Typically, the size (W/L) of hold-up transistor 210 may be the same size as pull-down transistor 212 or smaller, rather than the more typical 2.4 times the size of the pull-down transistor, depending on the length of the line and the amount of adjacent line coupling.

Figure 3:
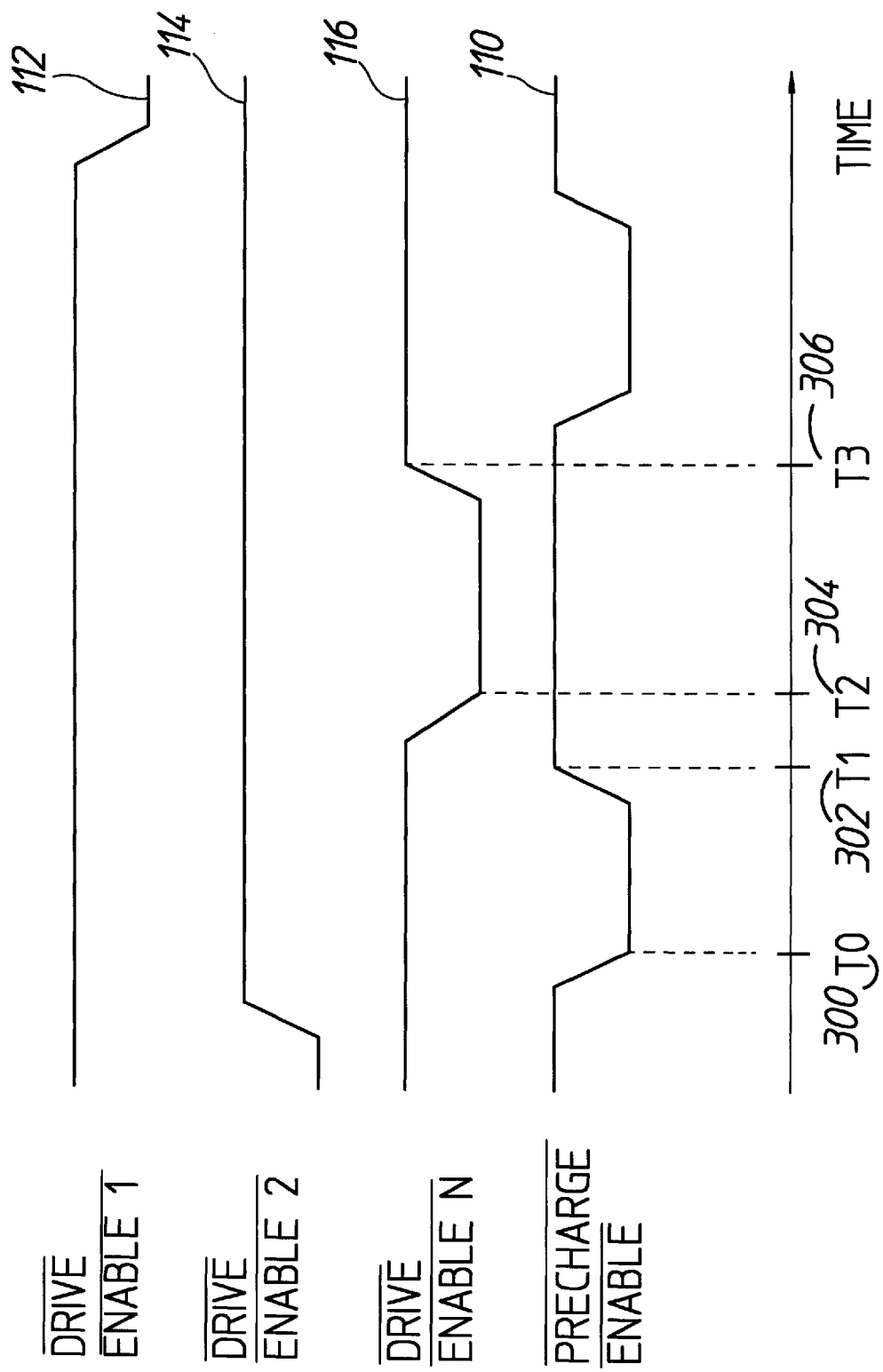
FIG. 3 is a timing diagram for signals illustrated in FIGS. 1 and 2.

FIG. 3 illustrates timing for $\overline{\text{DRIVE ENABLE}}$ (FIG. 1, 112, 114, 116) and $\overline{\text{PRECHARGE ENABLE}}$ (FIG. 1, 110). $\overline{\text{DRIVE ENABLE}}$ and $\overline{\text{PRECHARGE ENABLE}}$ are asymmetrical non-overlapping clock signals. For convenience in illustration, all enable signals are depicted as low level true but any or all can be high level true with appropriate modification to circuitry in FIGS. 1 and 2. When $\overline{\text{PRECHARGE ENABLE}}$ (110) is low, the circuit of FIG. 1 is in a precharge phase. At time T0 (300), the precharge transistor (FIG. 1, 108) is turned on. At time T1 (302), the precharge transistor is turned off. When any $\overline{\text{DRIVE ENABLE}}$ (112, 114, 116) signal is low, the circuit of FIG. 1 is in a drive phase. At time T2 (304), $\overline{\text{DRIVE ENABLE}}$ N (116) is low, enabling buffer amplifier 106 (FIG. 1). Note that only one buffer amplifier is enabled during any one drive phase. At time T3 (306), all buffer amplifiers are disabled. Non-overlapping clocks ensure that the precharge transistor is turned off before a buffer amplifier is enabled and ensure that all buffer amplifiers are disabled before the precharge transistor is turned on. As with precharge/pull-down circuits, it is necessary to latch data at the destination before the end of the drive phase. If no driver is enabled, all drivers are in a high impedance state and data is invalid.

As illustrated in FIG. 1, multiple drivers (102, 104, 106) may drive one line. If there were multiple driver circuits holding line 100 high and only one transistor pulling low, the transistor pulling low would have to overcome the hold-up current of all the other drivers combined. Therefore, the drivers are tri-stated and only one driver is enabled during any one drive phase.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An electronic system comprising:

a signal line driven by a plurality of driver circuits;

a precharge transistor that drives the signal line to a first logical level during a clock precharge phase;

each driver circuit receiving a logical input signal and an enable signal;

each driver circuit having a first driver transistor that drives the signal line to the first logical level during a clock drive phase when the received logical input signal logically requires the signal line to be at the first logical level and when the received enable signal is in an enable state; and the first driver transistor being in a high impedance state when the received enable signal is in a disable state, regardless of the state of the received logical input signal.

2. The electronic system of claim 1, each driver circuit further comprising:

a second driver transistor that drives the signal line to a second logical level during the clock drive phase when the received logical input signal logically requires the signal line to be at the second logical level and when the received enable signal is in the enable state.

3. The electronic system of claim 2, the first driver transistor having a size (width/length) that is less than twice a size of the second driver transistor.

* * * * *